United States Patent [19]
Hawkins et al.

[11] Patent Number: 5,141,596

[45] Date of Patent: Aug. 25, 1992

[54] METHOD OF FABRICATING AN INK JET PRINTHEAD HAVING INTEGRAL SILICON FILTER

[75] Inventors: William G. Hawkins, Webster; James F. O'Neill, Penfield; Donald J. Drake, Rochester, all of N.Y.

[73] Assignee: Xerox Corporation, Stamford, Conn.

[21] Appl. No.: 736,996

[22] Filed: Jul. 29, 1991

[51] Int. Cl.$^5$ .................... H01L 21/306; B44C 1/22; C03C 15/00; C03C 25/06
[52] U.S. Cl. .................... 156/628; 156/633; 156/644; 156/645; 156/647; 156/657; 156/661.1; 156/662; 346/140 R
[58] Field of Search ........... 156/628, 633, 634, 644, 156/645, 647, 656, 657, 661.1, 662; 346/140 R, 75, 1.1; 210/348, 483, 489, 498

[56] References Cited

U.S. PATENT DOCUMENTS

| | | | |
|---|---|---|---|
| 4,106,976 | 8/1978 | Chiou et al. | 156/644 |
| 4,169,008 | 9/1979 | Kurth | 156/600 |
| 4,417,946 | 11/1983 | Bohlen et al. | 156/643 |
| 4,455,192 | 6/1984 | Tamai | 156/628 |
| 4,589,952 | 5/1986 | Benringer et al. | 156/628 |
| 4,639,748 | 1/1987 | Drake et al. | 346/140 R |
| 4,733,823 | 3/1988 | Waggener et al. | 239/601 |
| 4,864,329 | 9/1989 | Kneezel et al. | 346/140 R |

Primary Examiner—William A. Powell
Attorney, Agent, or Firm—Robert A. Chittum

[57] ABSTRACT

An integral filter is fabricated by patterning a layer of etch resistant material on one side of a (100) silicon wafer to produce an array of equally spaced, uniformly sized posts or shapes and doping the exposed surface of the wafer by boron ion implant. The dopant is diffused into the wafer while the array of posts of etch resistant material masks the diffusion under them. The size of the posts or shapes determines the undoped areas of the wafer and, thus, the mesh size of the eventually produced integral filter. The wafer is recoated with a layer of etch resistant material and the other side, which was not doped, is patterned to form a plurality of sets of elongated channel vias and reservoir vias, one reservoir via for each set of channel vias. The wafer is orientation dependently etched for a predetermined time period to produce the sets of channel grooves and reservoir recesses, the recesses having a depth of about 75-85% of the wafer thickness, followed by etching of the wafer in an EDP etchant to finish etching the reservoirs through the wafer. The doped silicon area is not etched, so that an integral filter is produced having an arbitrary pore size determined by the size of the posts or shapes patterned initially prior to the diffused doping step.

15 Claims, 5 Drawing Sheets

METHOD OF FABRICATING AN INK JET PRINTHEAD HAVING INTEGRAL SILICON FILTER

BACKGROUND OF THE INVENTION

1. Field of the Invention

This invention relates to drop-on-demand ink jet printheads and more particularly, to a thermal ink jet printhead having an integral silicon filter over its ink inlet and process for fabricating the printhead with such filter. A copending, commonly assigned application Ser. No. 624,390, filed Nov. 30, 1990, entitled "Ink Jet Printhead Having Integral Filter" to Campanelli et al. discloses a related invention.

2. Description of the Prior Art

A typical thermally actuated drop-on-demand ink jet printing system uses thermal energy pulses to produce vapor bubbles in an ink-filled channel that expels droplets from the channel orifices of the printing system's printhead. Such printheads have one or more ink-filled channels communicating at one end with a relatively small ink supply chamber and having an orifice at the opposite end, also referred to as the nozzle. A thermal energy generator, usually a resistor, is located in the channels near the nozzle at a predetermined distance upstream therefrom. The resistors are individually addressed with a current pulse to momentarily vaporize the ink and form a bubble which expels an ink droplet. A meniscus is formed at each nozzle under a slight negative pressure to prevent ink from weeping therefrom.

U.S. Pat. No. 4,589,952 to Behringer et al discloses a method of making trenches having substantially vertical sidewalls in a silicon substrate using a three-level mask comprising a thick photoresist layer, a silicon nitrite layer, and a thin photoresist layer. Openings are formed in the thin photoresist layer and silicon nitrite layer by reactive ion etching in CF$_4$. The openings are continued through the thick photoresist by etching in an atmosphere containing oxygen. The exposed surface of the silicon substrate is then etched in a CF$_4$ atmosphere containing a low concentration of fluorine. Also disclosed is a method of making an electron beam transmissive mask wherein the openings are made using a three level mask and reactive ion etching of silicon using the etching technique of this invention.

U.S. Pat. No. 4,417,946 to Bohlen et al discloses a mask for structuring surface areas and a method of manufacture of such mask. The mask includes at least one metal layer with apertures which define the mask pattern and a semiconductive substrate for carrying the metal layer. A semiconductor substrate has through holes that correspond to the mask pattern. The through holes in the semiconductor substrate extend from the metal covered surface on the front to at least one tub shaped recess which extends from the other back surface into the semiconductor substrate. Holes are provided in a surface layer in the semiconductor substrate. The surface layer differs in its doping from the rest of the substrate and the holes which are provided in the surface layer have lateral dimensions larger than the apertures in the metal layer so that the metal layer protrudes over the surface layer.

U.S. Pat. No. 4,639,748 to Drake et al discloses an ink jet printhead having an internal filtering system and fabricating process therefor. Each printhead is composed of two parts aligned and bonded together. One part contains a linear array of heating elements and addressing electrodes on one surface. The other part has a parallel array of elongated recesses for use as ink channels and a common ink supplying reservoir recess in communication with the ink channels. The reservoir recess contains an integral closed wall defining a chamber with an ink-fill hole. Small passageways are formed in the internal chamber walls to permit passage of ink therefrom into the reservoir. Each of the passageways have smaller cross-sectional flow areas than the nozzles to filter the ink, while the total cross-sectional flow area of the passageways is larger than the total cross-sectional flow areas of the nozzles.

U.S. Pat. No. 4,864,329 to Kneezel et al discloses a thermal ink jet printhead having a flat filter placed over the inlet thereof by a fabrication process which laminates a wafer-size filter to the aligned and bonded wafers containing a plurality of printheads. The individual printheads are obtained by a sectioning operation, which cuts through the two or more bonded wafers and the filter. The filter may be a woven mesh screen or preferably an electroformed screen with predetermined pore size. Since the filter covers one entire side of the printhead, a relatively large contact area prevents delamination and enables convenient leak-free sealing.

U.S. Pat. No. 4,169,008 to Kurth discloses a process for producing uniform nozzle orifices for an ink jet printhead, wherein holes are anisotropically etched through a silicon wafer. To overcome the effect of variation in thickness of the wafer on the through holes, the wafer is masked on both sides, photopatterned and deeply etched on its reverse side, then etched on its obverse side to create uniformly sized nozzles therein.

U.S. Pat. No. 4,106,976 to Chiou et al discloses a method of manufacturing an ink jet nozzle for a printhead, wherein a silicon wafer is masked on both sides with an inorganic membrane or layer such as silicon dioxide, silicon nitride, glassy materials and the like. The mask on the reverse side is patterned, and anisotropically etched to produce through holes therein which expose the membrane mask on the obverse side. The membrane mask on the obverse side is patterned and precisely etched to form nozzles. This also overcomes the effect of etched nozzle sizes caused by variation in wafer thickness.

U.S. Pat. No. 4,455,192 to Tamai discloses a method of manufacturing a multi-nozzle ink jet printhead wherein a single crystal silicon substrate or plate is masked and an etch stop layer is implanted therein and a second single crystal silicon substrate is then grown onto the first over the patterned etch stop layer. The second silicon substrate is masked and anisotropically etched, so that a through recess is formed in the second substrate exposing the etch stop and the first substrate is through etched in areas without the etch stop to form nozzles therein.

U.S. Pat. No. 4,733,823 to Waggenener et al discloses the use of an etch stop layer of diffused phosphorous in the obverse surface of a silicon substrate and then coating both surfaces with an etch resistant material. The etch resistant material on the reverse side is patterned and anisotropically etched to produce recesses having the etch stop layer as a relative thin floor. The etch stop layer is patterned to form nozzles therein.

One problem associated with thermal ink jet technology is the sensitivity of ink droplet directionality to particulates in the ink. Print quality is directly related to accurate placement of the ink droplets on a recording medium and droplet directionality determines the accuracy of the ink droplet placement. It has been demonstrated that higher print quality is achieved with particulate-free ink sources and the degree of particulate-free ink is related to how close the final filtration of the ink is to the ink jet printhead. One source of particulate contamination is the manufacturing environment itself. At least partial solution to particulate-induced misdirectionality problems is to construct the entire transducer structure in a clean environment. However, complete particle-free fabricating environments are not economically practical. This invention reduces the problems of particle contamination during the fabrication of an ink jet printhead, as well as providing an ink filtration means during printing by the printhead.

SUMMARY OF THE INVENTION

It is object of the present invention to provide an ink jet printhead having an ink supply inlet having a filter integral therewith and method of fabrication therefor.

It is another object of the invention to provide an integral filter over the inlet of the printhead by a patterned etch stop layer on one side of a silicon substrate followed by orientation dependent etching (ODE) of channels and reservoir on the other side. The dimensions of the reservoir permit it to be etched through the silicon substrate and the patterned etch stop layer provides a grid of openings which will function as pores of a filter integrally fabricated in the reservoir inlet.

It is still another object of the invention to provide an integral filter over the inlet of the printhead by a patterned etch stop layer on one side of a silicon substrate followed by a two step orientation dependent etching (ODE) process on the other side wherein the channels are first etched and then the reservoir is separately etched to maintain dimensional control of the channel widths. The dimensions of the reservoir permit it to be etched through the silicon substrate and the patterned etch stop layer provides a grid of openings which will function as pores of a filter integrally fabricated in the reservoir inlet.

In the present invention, a plurality of ink jet printheads with integral filters are fabricated from two (100) silicon wafers. A plurality of sets of heating elements and their individually addressing electrodes are formed on the surface of one of the wafers and a corresponding plurality of sets of parallel channel grooves, each channel groove set communicating with a recessed reservoir, are formed in a surface of the other wafer. The two wafers are aligned and bonded together and individual printheads are obtained by a sectioning operation which cuts the mated wafers into a plurality of printheads. The integral filter is formed in the channel wafer by patterning an etch stop layer prior to anisotropically etching the plurality of reservoir recesses after having formed the plurality of sets of channels, so that the integral filter is formed when the reservoir recess is etched through the wafer.

Specifically, this invention relates to the fabrication of an ink jet printhead having an ink inlet with an integral filter to prevent contaminates from entering the printhead either during subsequent fabrication steps or during a printing mode by contaminates entrained in the ink. A layer of etch resistant material, such as silicon nitride, is deposited on both sides of the channel wafer. A layer of photoresist is deposited over the silicon nitride on one side of the channel wafer, patterned to form a plurality of sets of channel vias in the photoresist, using the patterned photoresist as a mask, the silicon nitride is patterned, then the photoresist is removed, and the wafer etched to form the sets of channel recesses. The silicon nitride is removed from both sides and then both sides recoated with a film of material suitable to act as an implant or diffusion barrier, such as silicon dioxide, so the etched channel recesses are also covered. The channel wafer side opposite the one with the etched channels is patterned to form a filter pattern. The filter pattern is produced by patterning the layer of barrier material on one side of the (100) silicon channel wafer to produce an array of equally spaced, uniformly sized posts or shapes and doping the exposed surface of the wafer by diffusion using a gas phase or solid source boron dopant, or by ion boron implantation, or by epitaxially growing a boron doped pattern. The dopant is diffused into the wafer while the array of posts of barrier material masks the diffusion under them. The size of the posts or shapes determines the undoped areas of the wafer and, thus, the mesh size of the eventually produced integral filter. The wafer is recoated with a layer of etch resistant material and the other side, which was not doped, is patterned to form a plurality of reservoir vias, one reservoir via for each previously etched set of channel recesses. The wafer is orientation dependently etched for a predetermined time period to produce the reservoir recesses, the recesses having a depth of about 75–85% of the wafer thickness, followed by etching of the wafer in an EDP etchant to finish etching the reservoirs through the wafer. The doped silicon area is not etched, so that an integral filter is produced having an arbitrary pore size determined by the size of the posts or shapes patterned initially prior to the diffused doping step. In another embodiment, the channels and reservoirs are concurrently etched after implantation, while in still another embodiment, the reservoir is etched by a single EDP etch process.

The foregoing features and objects will become apparent from a reading of the following specification in conjunction with the drawings, wherein like parts have the same index numerals.

DESCRIPTION OF THE PREFERRED EMBODIMENT

Figure 1:
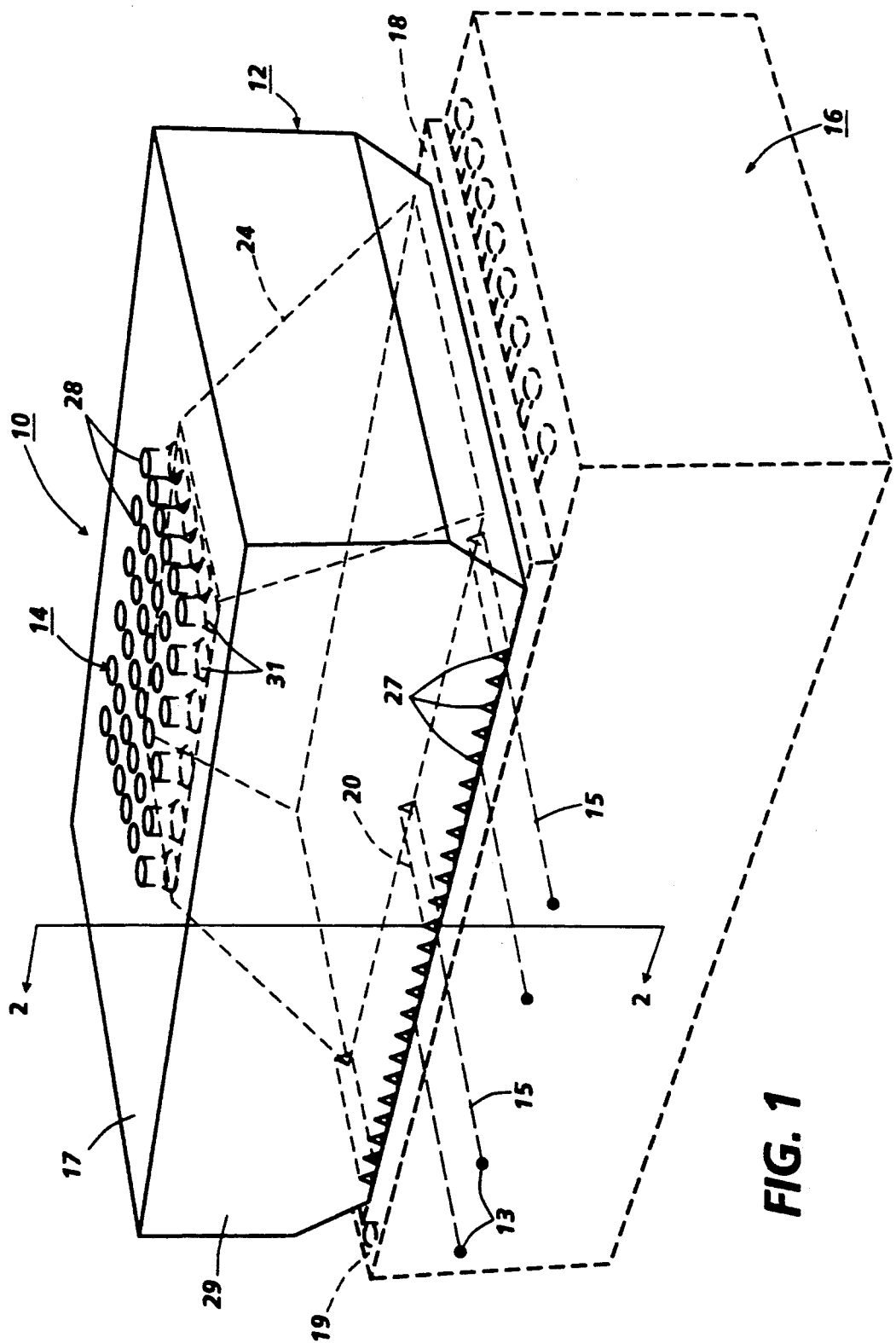
FIG. 1 is an enlarged schematic isometric view of a single printhead having the integral filter of the present invention and showing the ink droplet emitting nozzles.
Figure 2:
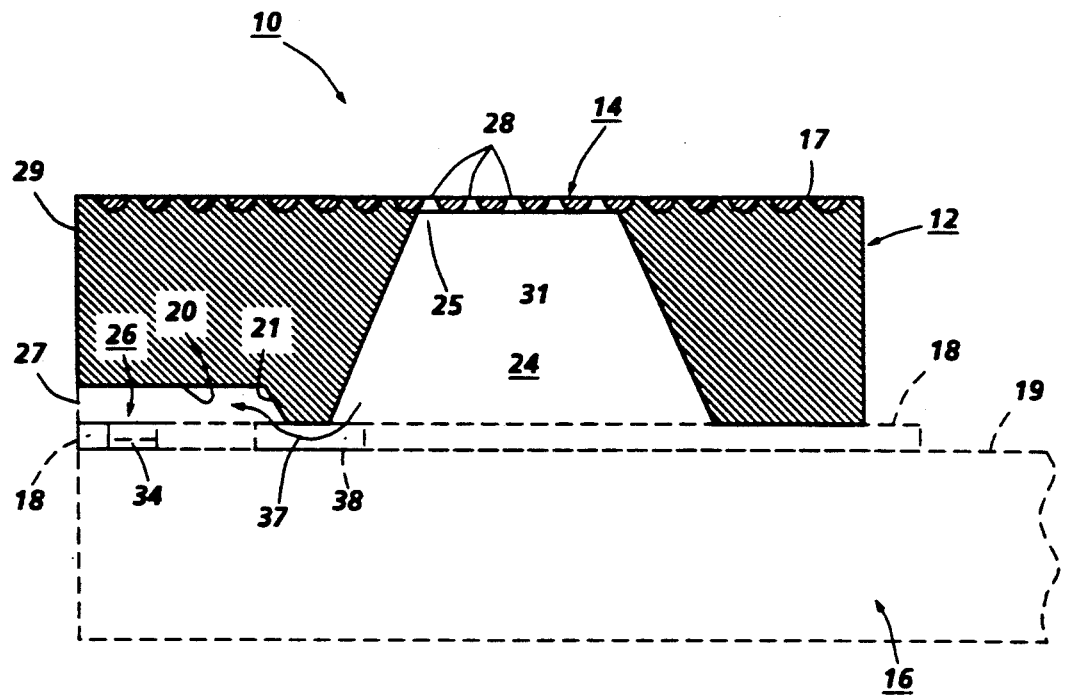
FIG. 2 is a cross-sectional view of the printhead as viewed along view line 2—2 of FIG. 1.

In FIGS. 1 and 2, a thermal ink jet printhead 10 of the present invention is shown comprising channel plate 12 with integral filter 14 and heater plate 16 shown in dashed line. A patterned thick film layer 18 is shown in dashed line having a material such as, for example, Riston ®, Vacrel ®, or polyimide, and is sandwiched between the channel plate and the heater plate. As disclosed in U.S. Pat. No. 4,774,530 to Hawkins and incorporated herein by reference in its entirety, the thick film layer is etched to remove material above each heating element 34, thus placing them in pits 26, and to remove material between the closed ends 21 of ink channels 20 and the reservoir 24 forming trench 38 in order to place the channels into fluid communication with the manifold. For illustration purposes, droplets 13 are shown following trajectories 15 after ejection from the nozzles 27 in front face 29 of the printhead.

Referring to FIG. 1, the printhead comprises a channel plate 12 that is permanently bonded to heater plate 16 or to the patterned thick film layer 18 optionally deposited over the heating elements and addressing electrodes on the top surface 19 of the heater plate and patterned as taught in the above-mentioned U.S. Pat. No. 4,774,530. The channel plate is silicon and the heater plate may be any insulative or semiconductive material as disclosed in the U.S. Pat. No. Re. 32,572 to Hawkins et al. The present invention is described for an edgeshooter type printhead, but could readily be used for a roofshooter configured printhead (not shown) as disclosed in U.S. Pat. No. 4,864,329 to Kneezel et al, wherein the ink inlet is in the heater plate, so that the integral filter of the present invention could be fabricated in an identical manner. The description of FIGS. 8 and 9 of U.S. Pat. No. 4,864,329 is herein incorporated by reference.

Channel plate 12 of FIG. 1 contains an etched recess 24, shown in dashed line, in one surface which, when mated to the heater plate 16, forms an ink reservoir. A plurality of identical parallel grooves 20, shown in dashed line and having triangular cross sections, are etched in the same surface of the channel plate with one of the ends thereof, after dicing, penetrating the front face 29 thereof. The other closed ends 21 (FIG. 2) of the grooves are adjacent the recess 24. Once the channel plate and heater plate are mated, they are diced. One end of the grooves are cut producing edge 29 and the orifices or nozzles 27. The grooves 20 serve as ink channels which connect the reservoir with the nozzles. The bottom 25 of the reservoir is about 2 to 20 $\mu$m thick and has a pattern of holes 28 etched therethrough to provide means for filtering ink as it enters the reservoir from an ink supply source (not shown). The pattern of holes are about 20×20 $\mu$m in size and are on about 40 $\mu$m center-to-center spacing. Since the holes are about one half to three quarter the cross-sectional areas of the nozzles, the pattern of holes in the bottom 25 of the reservoir functions as an inlet with an integral filter 14. Filter 14 of the present invention has been fabricated, as discussed later, by a pattern of posts or shapes 22 on the upper or top surface 17 of channel plate 32 (FIGS. 10 and 11) having a predetermined size in the range of 10-30 square $\mu$m which mask the top surface 17 of the silicon wafer, while the exposed portion thereof is doped, for example, by a boron implant, and subsequently annealed to a depth of about 2-20 $\mu$m to produce a patterned etch stop. When the reservoir is etched, the patterned etch stop forms an integral mesh filter with an arbitrary pore size, as determined by the posts of barrier material, such as, for example, silicon dioxide, initially lithographically produced.

In addition to filtering out contamination from the ink and ink supply system during printing, the filter also keeps dirt and other debris from entering the relatively large inlets during subsequent printhead assembly. In this way, it is possible to use less stringently clean and, therefore, less expensive assembly rooms for printhead manufacture, after the etched channel plate has been aligned and bonded to the heater plate. Operations up through assembly of the bonded channel and heater wafers will need to occur in a clean room or under a clean hood, while subsequent operations can compromise somewhat on cleanliness.

Figure 3:
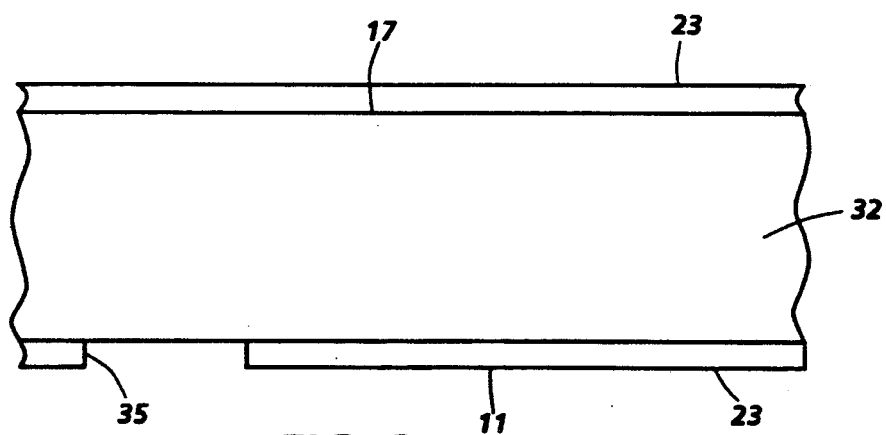
FIGS. 3–9 show partial cross-sectional views of the channel wafer during subsequent fabricating steps.

The fabricating process for the channel plate having an ink inlet with integral filter is shown in FIGS. 3-9, wherein each Figure is a partially shown, cross-sectional view of a (100) silicon wafer having a thickness of about 20 mils or 500 $\mu$m. Though many identical channel plates 12 are simultaneously processed in the channel wafer 32, the portion shown is of only a single channel plate. Referring to FIG. 3, the channel wafer is cleaned and a layer 23 of an etch resistant material, such as, for example, silicon nitride, is deposited on both top side 17 and bottom side 11 thereof to a thickness of about 1,500 Å. A photoresist layer (not shown) is deposited over the silicon nitride layer 23 on the wafer bottom side 11 and patterned to form a plurality of sets of elongated, parallel channel vias (not shown) and an identical plurality of sets of vias 35 in the silicon nitride layer 23 is formed, using the patterned photoresist layer as a mask, exposing the bottom surface 11 of wafer 32 through the silicon nitride layer vias 35. The photoresist layer is removed and the wafer, as shown in FIG. 3, is ready to be placed in an anisotropic etch bath, such as KOH.

Figure 4:
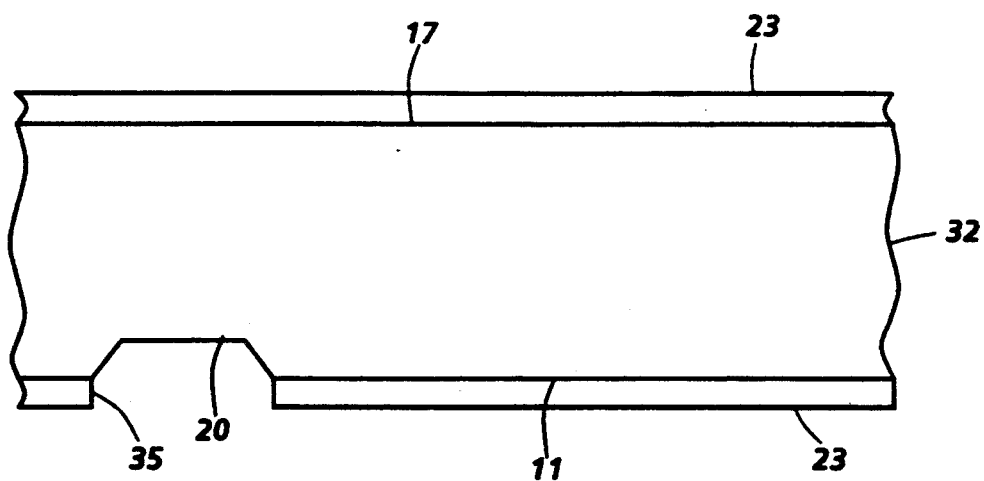
Figure 5:
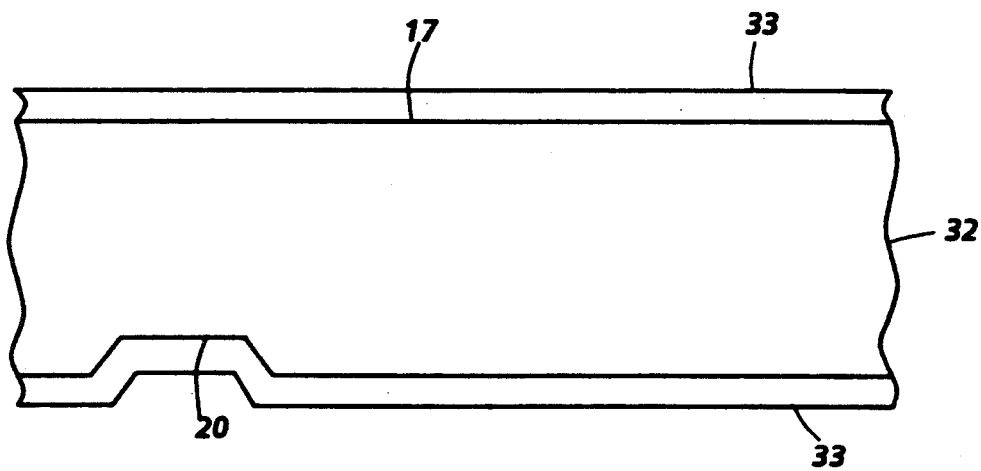

FIG. 4 shows the anisotropically etched channels 20 in the wafer bottom surface 11, after removal from the etch bath, and the silicon nitride layer 23 is stripped from the wafer by means well known in the art, cleaned, and then a barrier layer 33, such as, for example, silicon dioxide, is again deposited on both sides of the wafer, as shown in FIG. 5. The sets of elongated, parallel channels are covered by this barrier layer 33 to protect them from exposure to other subsequent etch steps, thereby maintaining the close dimensional control of the channel widths provided by the limited time exposure to the etchant during the etching of the channels.

Figure 6:
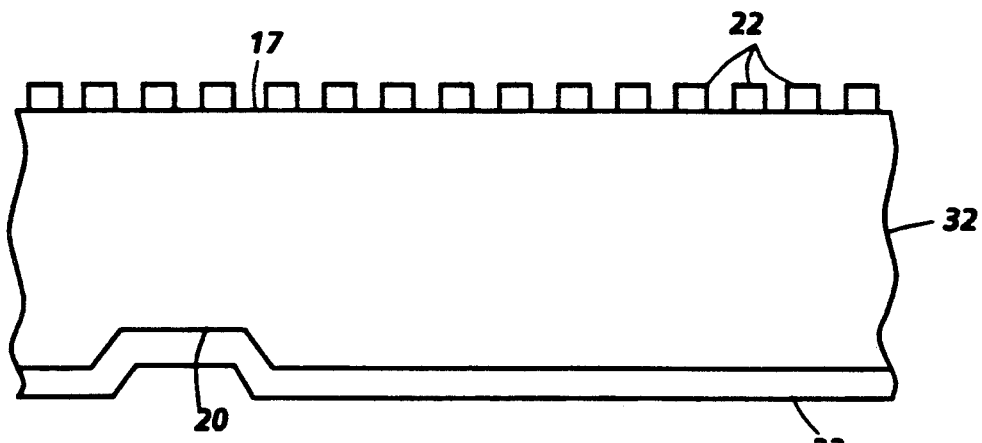
Figure 10:
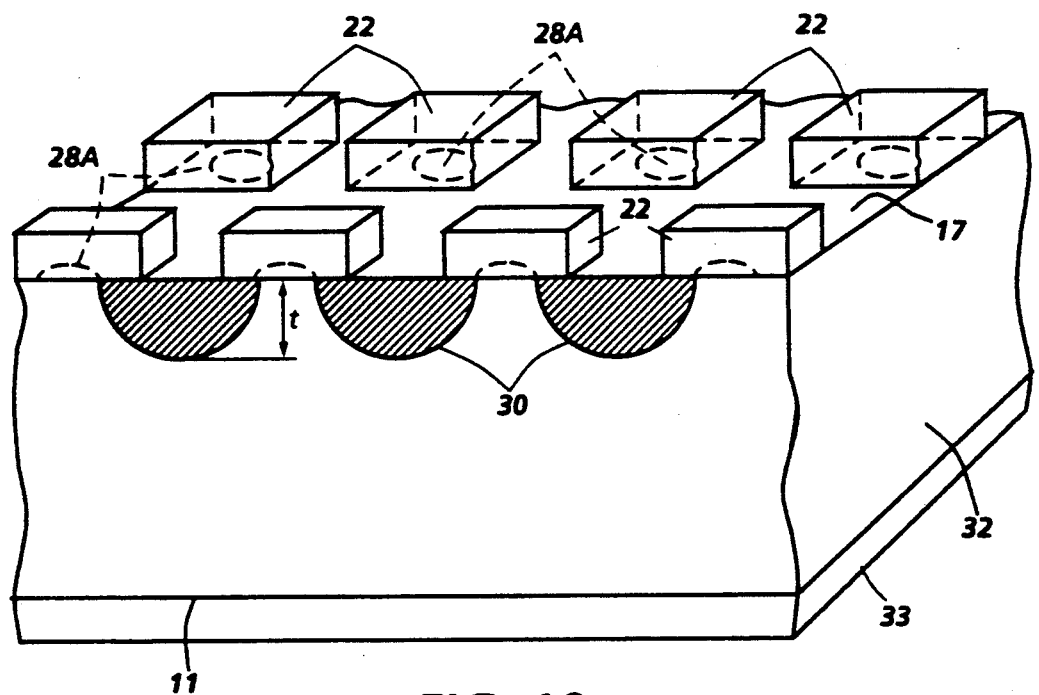
FIG. 10 is an enlarged, partially shown schematic, isometric view of the wafer in FIG. 6.
Figure 11:
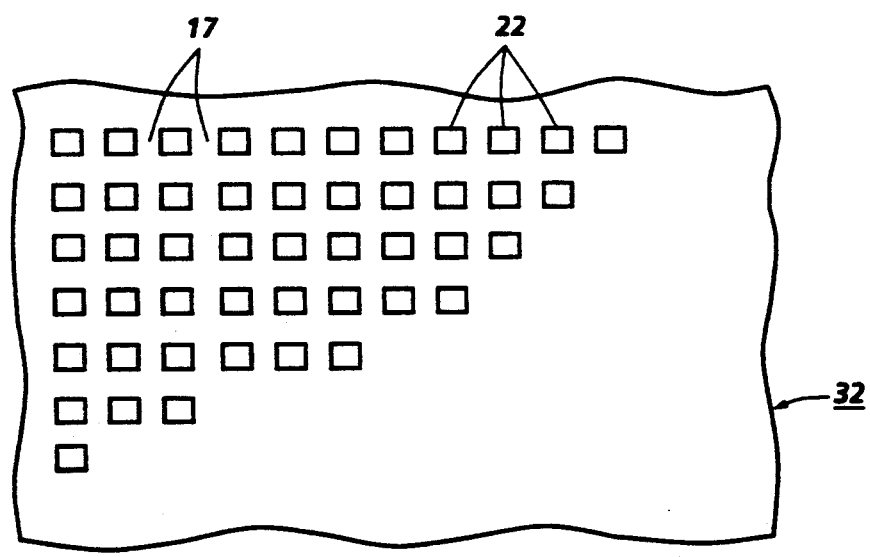
FIG. 11 is a partially shown plan view of a silicon wafer having an array of equally spaced and dimensioned posts of barrier material.

A layer of photoresist (not shown) is applied to silicon dioxide barrier layer 33 on the top surface 17 of the wafer 32. The photoresist layer is patterned to produce an array of equally spaced and equally sized posts (not shown) designed to have the appropriate dimensions to form a grid pattern of openings or pores that will later assist in the forming of the integral filters. Although different shapes of posts could be used, 20×20 $\mu$m squares on 40 $\mu$m centers are used in the preferred embodiment. Using the posts of photoresist as a mask, the exposed silicon dioxide is patterned to produce an array of silicon dioxide posts or shapes 22, and then the photoresist posts are removed, leaving only the posts 22 formed from the silicon dioxide barrier layer 33 on the wafer top side surface 17, as shown in FIGS. 6 and 11. FIG. 11 is a partial plan view of the wafer 32 in FIG. 6, showing the uniform pattern of posts 22 over the entire top surface of the wafer. Optionally, the posts are patterned only over areas (not shown) which will subsequently become the reservoir inlets. Photoresist may be used as the barrier and patterned to form the filter pattern of posts instead of silicon dioxide used in the preferred embodiment. Next, the top surface 17 of the wafer is doped with boron to a concentration of $10^{20}$ boron ions/cc and to a desired depth "t" of 2-10 $\mu$m. Alternatively, the patterned wafer surface may be doped by diffusion, using a gas phase or solid source boron and a silicon nitride mask, or by epitaxially growing a boron doped pattern. The boron implant or the boron diffusion is followed by an annealing process to drive in the boron dopant. The annealing temperature is about 1,100° C. and the annealing time is about 0.5 hours. This annealing of the boron dopant also causes it to diffuse inwardly under the silicon dioxide posts, leaving undoped area 28A shown in dashed line under each post of 10 to 30 μm, as shown in FIG. 10, an enlarged partially shown isometric view of the wafer in FIG. 6. The purpose of this boron dopant is to function as a patterned etch stop 30 which will subsequently produce the integral filter in the ink inlet for the printhead reservoir, as will become more apparent later.

Figure 7:
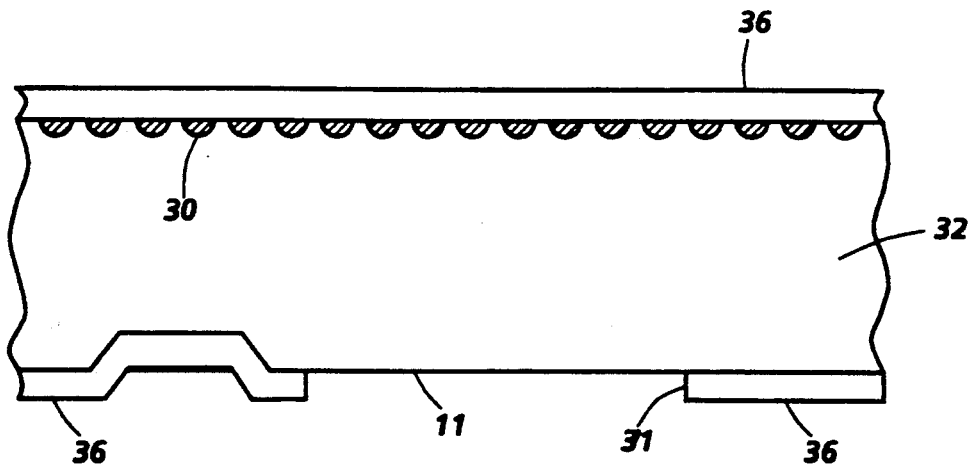
Figure 8:
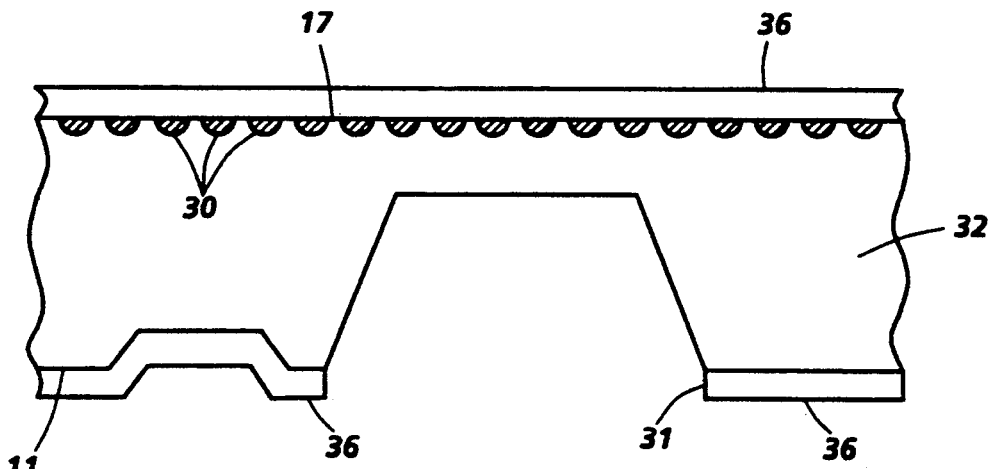

The silicon dioxide posts 22 on the top surface of the wafer and silicon dioxide barrier layer 33 on the bottom surface at the wafer are removed, and a layer of etch resistant material, such as, for example, silicon nitride or silicon dioxide is deposited on the top and bottom surfaces of the wafer. The etch resistant layer 36 of, preferably silicon nitride, has a uniform thickness of about 1,500 Å. Referring to FIG. 7, the silicon nitride layer 36 on the bottom side 11 of the wafer is patterned after having photolithographically defined another photoresist deposition (not shown) on the silicon nitride layer on the bottom surface 11 of the wafer to form a plurality of relatively large rectangular reservoir vias 31; each set of previously formed channel grooves 20 has at least one reservoir via 31. After the photoresist layer is removed, the wafer shown in FIG. 7 is initially anisotropically etched in, for example, potassium hydroxide (KOH). For a composition of 30% KOH at an operating temperature of 95° C., the wafer is etched for two and three quarters hours to three and one-half hours to produce the reservoir recesses. The time in the KOH etchant determines the depth of the reservoir recess, which in the preferred embodiment is about three quarters of the thickness of the 20 mil thick wafer or about 15 mils (375 μm), as shown in FIG. 8.

Figure 9:
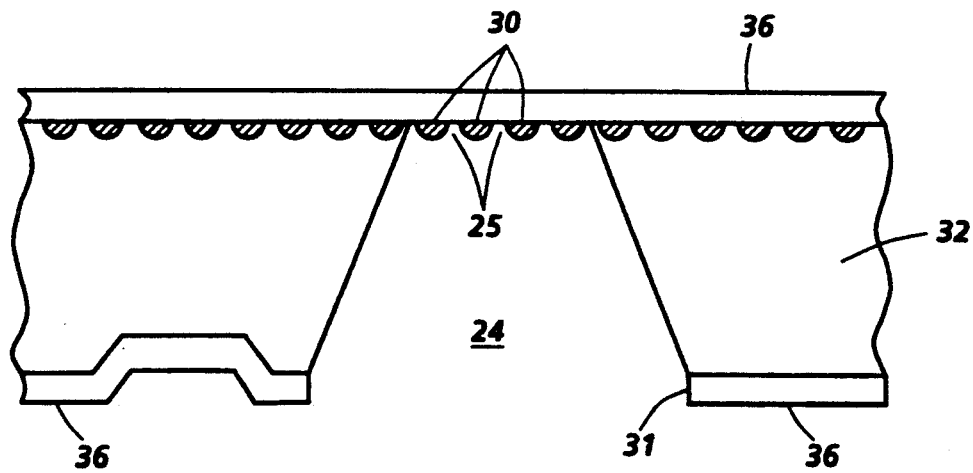

After the wafer is removed from the KOH bath and cleaned, it is then placed into a bath of (EDP) etchant, which has an etch rate dependent on both silicon doping and silicon crystal plane orientation, until the etching is through the wafer as shown in FIG. 9, so that the open bottom 25 of the reservoir recess 24 may function as an ink inlet. The patterned etch stop 30 produced by the boron implant is not etched by the EDP etchant, thus providing a grid of openings or pores 28 which are covered by the layer 36 of etch resistant material, preferably silicon nitride.

After the layer 36 of silicon nitride is stripped from the top and bottom surfaces of the wafer 32, it is aligned and bonded to the heater wafer as described in U.S. Pat. No. 4,774,530 to Hawkins and diced into a plurality of individual printheads. One of the dicing cuts is across and perpendicular to the channel at a predetermined distance downstream from the heating elements, producing the front or nozzle face 29 and the open end of the channels become the nozzles 27, as shown in FIGS. 1 and 2.

In the preferred embodiment, the entire top surface of wafer 32 contains the patterned etch stop 30, so that no alignment between the patterns on opposite sides of the wafer is necessary. In an alternate embodiment the patterned etch stop is located in predetermined locations, and the via 31 in the second layer 33 of silicon nitride is aligned therewith. In both embodiments, the fabrication process provides single side orientation dependent etching process. The channels may be opened to the reservoir during the EDP etch step, by dicing, or the thick film layer 18 may be patterned to provide trench 38 therein which enables the ink to bypass the channel closed end 21, as shown by arrow 37. Either of these embodiments enables total fabrication of a printhead having an ink inlet with an integral filter without the need of a clean room environment, after the channel wafer and heating element wafer are mated.

In another embodiment, not shown, the channel grooves may be produced by reactive ion etching (RIE) or isotropic etching while the reservoir with the integral filter may be produced by anisotropic etching as described above. The use of RIE to produce the channels will require an etch mask that is not erodable by the RIE and requires a separate etch resistant mask for the reservoirs; however, the RIE process produces channels with vertical walls, thus rectangular nozzles, which may be advantageous over the triangular shaped channels produced by anisotropic etching. Isotropic etching may be used to produce only the channels, since they are relatively shallow and the etching time is short. The advantage of using isotropic etching to produce the channels is that they would have a hemispherical cross-sectional recess as opposed to a triangular cross-section produced by anisotropic etching.

Still other embodiments of the present invention include concurrently orientation dependently etching both the sets of channel grooves and reservoirs in one surface of the wafer, after the patterned boron implant has been completed in the other wafer surface, and a single etching process for the reservoirs using EDP, instead of the above-described two etch step process, using first KOH as the etchant to etch the reservoir recesses about three quarters through the wafer and then using EDP as the etchant to finish etching the reservoirs completely through the wafer. In both processes, the patterned boron doped regions are not etched, thus forming ink inlets having an integral filter. One advantage of using EDP as the ODE etchant is that a relatively thin layer of silicon dioxide may be used as the etch resistant mask.

Many modifications and variations are apparent from the foregoing description of the invention and all such modifications and variations are intended to be within the scope of the present invention.

We claim:

1. A method of fabricating ink jet printheads having integral ink inlet filters, comprising the steps of:
   (a) depositing a first layer of an etch resistant material on the top and bottom surfaces of a (100) silicon wafer;
   (b) applying and patterning a first photoresist layer on the first etch resistant layer on the bottom surface of the wafer to form a plurality of sets of elongated, parallel channel vias;
   (c) forming identical vias in the first etch resistant layer using the patterned first photoresist layer as a mask and exposing the bottom surface of the wafer through the vias in said first etch resistant layer;
   (d) removing the patterned first photoresist layer;
   (e) etching the bottom surface of the wafer through the vias in the first etch resistant layer for a predetermined time period to form a plurality of sets of parallel channel grooves;
   (f) removing the first etch resistant layer from the top and bottom surfaces of the wafer;
   (g) depositing a layer of barrier material on the top and bottom surfaces of the wafer, including the plurality of sets of etched channel grooves in the wafer bottom surface;

(h) applying and patterning a second photoresist layer on the barrier layer on the top surface of the wafer to form a pattern of equally spaced and equally sized posts, the posts having a predetermined location and dimension;

(i) using the posts of the second photoresist layer as a mask and removing the exposed areas of the barrier layer on the top surface of the wafer to form posts from the barrier layer and to expose the remainder of the wafer top surface;

(j) removing the second photoresist posts;

(k) doping the exposed top surface of the wafer with a dopant while using the barrier layer posts as a mask, thus forming a doped mesh pattern in the top surface of the wafer;

(l) annealing the dopant for a predetermined time and at a predetermined temperature, the annealing causing the dopant volume to expand concurrently inwardly under the posts of barrier material, whereby a substantially equal area of predetermined size is left undoped under each post of barrier material;

(m) removing the posts of barrier material from the top surface of the wafer and concurrently removing the layer of barrier material from the bottom surface of the wafer;

(n) depositing a second layer of etch resistant material on the top and bottom surfaces of the wafer, including the etched channel grooves in the wafer bottom surface;

(o) applying and patterning a third photoresist layer on the second etch resistance layer on the bottom surface of the wafer to form a plurality of reservoir vias, at least one reservoir via for each set of channel grooves;

(p) forming identical vias in the second layer of etch resistant material using the patterned third photoresist layer as a mask and exposing the bottom surface of the wafer through the vias in said second layer of etch resistant material;

(q) removing the third patterned photoresist layer;

(r) etching the bottom surface of the wafer through the vias in the second layer of etch resistant material by placing the wafer into an etchant bath and orientation dependently etching of each of the reservoir recesses through the wafer along the {111}planes, the doped areas of the wafer not being etched, so that the pattern of undoped areas, which are etched through in a pattern of openings, may serve subsequently as pores of filters integral with ink inlets for each reservoir recess;

(s) removing the second etch resistant layer from the top and bottom surfaces of the wafer;

(t) forming a linear array of heating elements and addressing electrodes on the top surface of an electrically insulative or semiconductive, planar, wafer-size substrate for enabling the individual, selective application of electrical pulses to the heating elements;

(u) aligning and bonding the bottom surface of the silicon wafer having the channel grooves and reservoir recesses with the top surface of the planar substrate having the heating elements, so that each groove forms an ink channel and contains a heating element therein, the integral filters preventing entry of contaminating particles into the reservoirs which are larger than the filter openings during subsequent fabrication steps; and (v) dicing the mated wafer and substrate into a plurality of individual printheads, one of the dicing cuts being along planes perpendicular to the channels and a predetermined distance downstream from the heating elements to produce channel open ends that will serve as nozzles, ink supplied to the printhead reservoir being filtered by the integral filter in the inlet during entry of the ink therein.

2. The fabrication method of claim 1, wherein the method further comprises the step of:

(w) after step (t), depositing and patterning a thick film polymeric layer over the heating elements and addressing electrodes having a predetermined thickness, so that the thick film layer is removed over each heating element, thus placing the heating elements in pits, and trenches are produced at predetermined locations to provide the means for communication between the channels and the reservoirs at the conclusion of step (u).

3. The fabrication method of claim 1, wherein the pattern of posts in steps (h) and (i) substantially covers the entire top surface of the wafer, so that the reservoirs patterned and etched in the bottom surface of the wafer do not have to be aligned with the post pattern.

4. The fabrication method of claim 1, wherein the pattern of posts in steps (h) and (i) are in predetermined groups at predetermined locations on the top surface of the wafer, so that the reservoirs patterned and etched in the bottom surface of the wafer may be readily aligned therewith.

5. The fabrication method of claim 1, wherein the etching of channel grooves in step (e) is anisotropic to form etched channel grooves having a triangular cross-section.

6. The fabrication method of claim 1, wherein the etching of channel grooves in step (e) is isotropic to form etched channel grooves having a hemispheric cross-section.

7. The fabrication method of claim 1, wherein the etching of channel grooves in step (e) is RIE to form etched channel grooves having vertical walls.

8. The fabrication method of claim 1, wherein the etching of step (r) is anisotropic and the etchant used in the etchant bath is EDP, and wherein the etch resistant material is silicon dioxide.

9. The fabrication method of claim 1, wherein the etching step (r) comprises a two step etching process of: first, anisotropically etching the bottom surface of the wafer through the vias in the second layer of etch resistant material in KOH for a predetermined time period to form a plurality of reservoir recesses, the reservoir recesses having a predetermined depth based upon the etching time period, and, second, placing the wafer into an EDP etchant bath to complete the etching of each of the reservoir recesses through the wafer along the {111} planes.

10. The fabrication method of claim 9, wherein the predetermined depth of the reservoir recess etched by the KOH is about three quarters of the thickness of the wafer.

11. A method of fabricating ink jet printheads having integral ink inlet filters, comprising the steps of:

(a) depositing a layer of barrier material on top and bottom surfaces of a (100) silicon wafer;

(b) applying and patterning a first photoresist layer on the barrier layer on the top surface of the wafer to form a pattern of equally spaced and equally sized posts, the posts having a predetermined location and dimension;

(c) using the posts of the first photoresist layer as a mask to pattern and to remove the exposed areas of the barrier layer on the top surface of the wafer to form posts from the barrier layer, thereby exposing the remainder of the wafer top surface;

(d) removing the first photoresist posts;

(e) doping the exposed top surface of the wafer with a dopant while using the barrier layer posts as a mask, thus forming a doped mesh pattern in the top surface of the wafer;

(f) annealing the dopant for a predetermined time and at a predetermined temperature, the annealing causing the dopant volume to expand concurrently inwardly under the posts of barrier material, whereby a substantially equal area of predetermined size is left undoped under each post of barrier material;

(g) removing the posts of barrier material from the top surface of the wafer and concurrently removing the layer of barrier material from the bottom surface of the wafer;

(h) depositing a layer of etch resistant material on the top and bottom surfaces of the wafer;

(i) applying the patterning a second photoresist layer on the etch resistance layer on the bottom surface of the wafer to form a plurality of sets of elongated, parallel channel vias and a plurality of reservoir vias, at least one reservoir via for each set of channel vias;

(j) forming identical vias in the layer of etch resistant material using the patterned second photoresist layer as a mask and exposing the bottom surface of the wafer through the vias in said second layer of etch resistant material;

(k) removing the second patterned photoresist layer;

(l) etching the bottom surface of the wafer through the vias in the layer of etch resistant material by placing the wafer into an etchant bath and etching the bottom surface of the wafer to form a plurality of sets of channel grooves and reservoir recesses, each of the reservoir recesses being etched through the wafer along the {111}planes, the doped areas of the wafer not being etched, so that the pattern of undoped areas, which are etched through in a pattern of openings, may serve subsequently as pores of filters integral with ink inlets for each reservoir recess;

(m) removing the etch resistant layer from the top and bottom surfaces of the wafer;

(n) forming a linear array of heating elements and addressing electrodes on the top surface of an electrically insulative or semiconductive, planar, wafer-size substrate for enabling the individual, selective application of electrical pulses to the heating elements;

(o) aligning and bonding the bottom surface of the silicon wafer having the channel grooves and reservoir recesses with the top surface of the planar substrate having the heating elements, so that each groove forms an ink channel and contains a heating element therein, the integral filters preventing entry of contaminating particles into the reservoirs which are larger than the filter openings during subsequent fabrication steps; and (p) dicing the mated wafer and substrate into a plurality of individual printheads, one of the dicing cuts being along planes perpendicular to the channels and a predetermined distance downstream from the heating elements to produce channel open ends that will serve as nozzles, ink supplied to the printhead reservoir being filtered by the integral filter in the inlet during entry of the ink therein.

12. The fabrication method of claim 11, wherein the method further comprises the step of:

(q) after step (n), depositing and patterning a thick film polymeric layer over the heating elements and addressing electrodes having a predetermined thickness, so that the thick film layer is removed over each heating element, thus placing the heating elements in pits, and trenches are produced at predetermined locations to provide the means for communication between the channels and the reservoirs at the conclusion of step (o).

13. The fabrication method of claim 11, wherein the pattern of posts in steps (b) and (c) substantially covers the entire top surface of the wafer, so that the reservoirs patterned and etched in the bottom surface of the wafer do not have to be aligned with the post pattern.

14. The fabrication method of claim 11, wherein the pattern of posts in steps (b) and (c) are in predetermined groups at predetermined locations on the top surface of the wafer, so that the reservoirs patterned and etched in the bottom surface of the wafer may be readily aligned therewith.

15. The fabrication method of claim 11, wherein the etching of channel grooves in step (l) is by orientation dependent etching, so that the etched channel grooves have a triangular cross-section.

* * * * *